United States Patent [19]
Murayama et al.

[11] Patent Number: 4,678,536
[45] Date of Patent: Jul. 7, 1987

[54] METHOD OF PHOTOCHEMICAL SURFACE TREATMENT

[75] Inventors: Seiichi Murayama, Kokubunji; Kanji Tsujii, Tokyo; Yusuke Yajima, Musashino, all of Japan

[73] Assignee: Hitachi, Ltd., Tokyo, Japan

[21] Appl. No.: 799,976

[22] Filed: Nov. 20, 1985

[30] Foreign Application Priority Data

Nov. 21, 1984 [JP] Japan ............................. 59-244444

[51] Int. Cl.$^4$ .................... H01L 21/306; B05D 3/06; B44C 1/22; C03C 15/00
[52] U.S. Cl. ................................. 156/635; 156/643; 156/646; 156/654; 156/345; 427/38; 427/55
[58] Field of Search ............... 156/643, 646, 635, 654, 156/345; 427/38, 39, 53.1, 54.1, 55; 219/121 LH, 121 LJ, 121 LL, 121 LM

[56] References Cited

U.S. PATENT DOCUMENTS

| | | | |
|---|---|---|---|
| 2,841,477 | 7/1958 | Hall | 156/643 X |
| 3,364,087 | 1/1968 | Solomon et al. | 156/643 X |
| 4,478,677 | 10/1984 | Chen et al. | 156/646 X |
| 4,566,937 | 1/1986 | Pitts | 156/628 |

OTHER PUBLICATIONS

O. Butsuri, *Applied Physics*, No. 6, vol. 53, Jan. 23, 1984, pp. 516-520.
Glass et al., "Interaction of Metal Particles with Adsorbed Dye Molecules: Absorption and Luminescence", *Optics Letters*, vol. 5, No. 9, Sep. 1980, pp. 368-370.
Abstract of the Binary Meeting of the Japan Society of Applied Physics, p. 344.
WO-A-8 304 269 (Mass. Inst. of Technology), claim 1, p. 3, last paragraph, p. 4, first paragraph.
Patent Abstracts of Japan, vol. 7, No. 200 (E-196) [1345], Sep. 3, 1983; & JP-A-58-98929 (Suwa Seikosha) 06-13-1983.
Thin Solid Films, vol. 92, Nos. ½, Jun. 1982, pp. 33-40, Lausanne, CH; Y. Kurogi: "Recent Trends in Dry Etching", Section 3, pp. 35-36.
Extended Abstracts of the 15th Conference on Solid State Devices and Materials, (supplement to the Japanese Journal of Applied Physics, 1983) pp. 109-115; P. K. Boyer et al: "Microelectronic Thin Film Deposition by UV Laser Photolysis".

*Primary Examiner*—William A. Powell
*Attorney, Agent, or Firm*—Antonelli, Terry & Wands

[57] ABSTRACT

A method of photochemically treating a surface of a material is disclosed which includes a step of introducing a reaction gas into a reaction chamber having a substrate therein, to make the reaction gas be adsorbed on the surface of the substrate, and a step of exposing the substrate to radiation of a wavelength at which the absorption of radiation energy by the reaction gas existing in the inner space of the reaction chamber is negligibly small and the radiation energy is absorbed by the reaction gas adsorbed on the surface of the substrate, wherein the kind of the reaction gas and the wavelength of the radiation are selected so that the surface of a predetermined material forming a pattern on the substrate can be selectively treated.

4 Claims, 7 Drawing Figures

FIG. IA
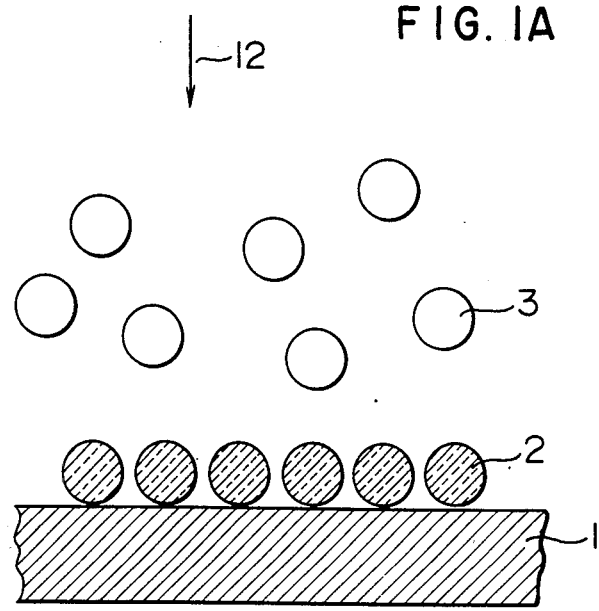
FIG. IB
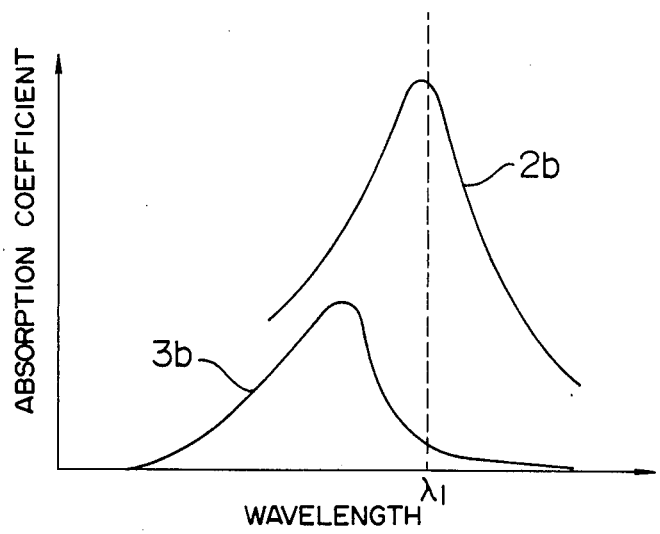

METHOD OF PHOTOCHEMICAL SURFACE TREATMENT

BACKGROUND OF THE INVENTION

The present invention relates to a method of photochemically treating the surface of a material such as a semiconductor substrate by utilizing radiation energy to form a thin film on the surface with the precision of atomic scale, or one or a few atomic (or molecular) layers of the surface are removed to etch the surface, and more particularly to a method of photochemical surface treatment suitable for use in the case where a thin film having a predetermined pattern is formed on the above surface or the surface is etched to a predetermined pattern.

The so-called atomic layer epitaxy for depositing one or a few atomic (or molecular) layers repeatedly on a substrate to form a film is a very excellent technique capable of producing a thin film having a good crystalline quality. As described on pages 516 to 520 of the June 1984 issue of the OHYOH BUTURI (the proceeding of the Japan Society of Applied Physics), the following surface treatment is carried out in the conventional atomic layer epitaxy. A first gas is introduced into a chamber in which a substrate maintained at a predetermined temperature is disposed, and then the chamber is evacuated to leave the one molecular layer (namely, the first molecular layer) of gas molecules adsorbed on the surface of the substrate. Thereafter, the second gas (or the first gas) is introduced into the chamber and then the chamber is again evacuated, to form the second molecular layer on the first molecular layer or to form the third molecular layer on the surface of the substrate as a result of the reaction of the second molecular layer with the first molecular layer. By repeating the above process, a film can be formed on the substrate with the precision of atomic scale. However, it is required to carry out the introduction of gas into the chamber and the evacuation of the chamber alternately and repeatedly, and hence the conventional atomic layer epitaxy has a drawback that a thin film cannot be grown at high speed. Further, the above epitaxy has another drawback that it is impossible to selectively grow a thin film only on the predetermined material forming a pattern on the substrate.

SUMMARY OF THE INVENTION

It is an object of the present invention to provide a method of photochemical surface treatment capable of forming a thin film with an excellent crystalline quality on the predetermined material forming a pattern on the substrate at high speed by selectively depositing the thin film with the precision of atomic scale, and capable of selectively etching one or a few atomic (or molecular) layers of the predetermined material forming a pattern on the substrate at high speed.

In order to attain the above object, a method of photochemical surface treatment according to the present invention comprises the steps of: introducing a gas into a reaction chamber having a substrate therein, so that the surface of the substrate adsorbs the gas; and exposing the substrate to radiation having a wavelength at which the absorption of radiation energy by the gas existing in the inner space of the reaction chamber is negligibly small and the radiation energy is absorbed by the reaction gas adsorbed on the surface of the substrate; in the above-mentioned steps, the kind of the gas and the wavelength of the radiation should be selected so that the surface of the predetermined material forming a pattern on the substrate can be selectively treated.

According to the above method, a film can be formed selectively on the predetermined material forming a pattern on a substrate at high speed and the predetermined material forming a pattern on the substrate can be selectively etched at high speed. Thus, the throughput can be greatly increased.

BRIEF DESCRIPTION OF THE DRAWINGS

FIGS. 1A and 1B are schematic diagram and an absorption spectrum chart for explaining the principle of the present invention, respectively.

DESCRIPTION OF THE PREFERRED EMBODIMENTS

Figure 2:
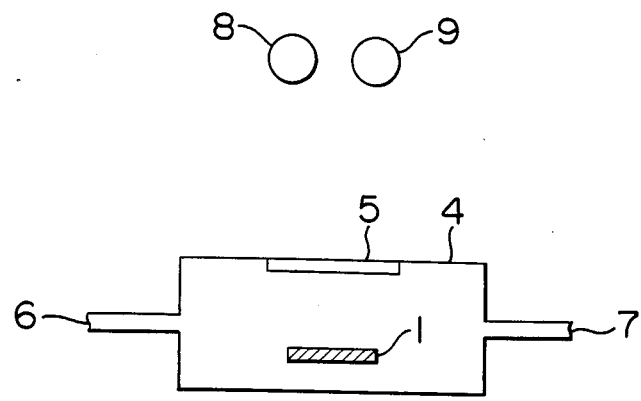
FIG. 2 is a schematic diagram showing the fundamental structure of an apparatus for carrying out a method of photochemical surface treatment according to the present invention.
Figure 3:
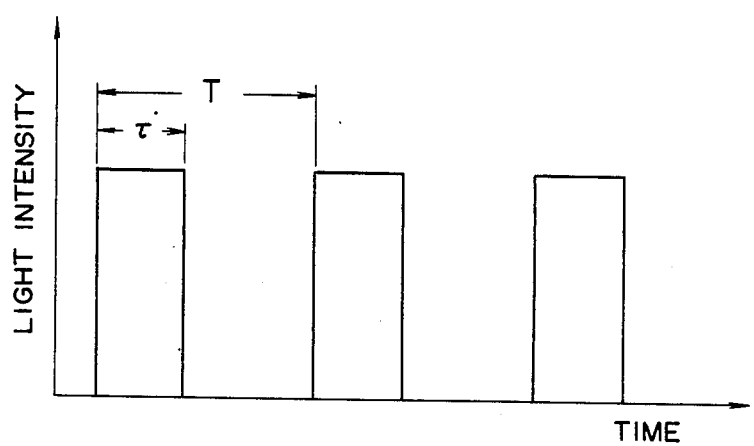
FIG. 3 is a waveform chart showing a pulse train of pulse-like light which is used as the exciting radiation in the present invention.

The present invention will be explained below in detail referring to the accompanying drawings.

Prior to the explanation of preferred embodiments of the present invention, the principle thereof will first be explained.

The present invention utilizes the phenomenon that the absorption spectrum of a molecule adsorbed on the surface of the substrate differs from the absorption spectrum of the molecule existing in a free space. This phenomenon is described on pages 368 to 370 of the September 1984 issue (Vol. 5, No. 9) of the Optics Letters, and on page 344 of the Abstract of the biannual meeting of the Japan Society of Applied Physics held in the autumn of 1984. Further, the present inventors found that the surface of a substrate could be photochemically treated by using an appropriate combination of a gas adsorbed on the substrate surface, the material of the substrate, and the wavelength of radiation incident on the substrate surface. Referring to FIG. 1A, a molecule 2 held, by adsorption, on a substrate 1 has an absorption spectrum different from that of a molecule 3 which is of the same kind as the molecule 2 but exists in a free space, due to interaction of the molecule 2 with the substrate 1. For example, as shown in FIG. 1B, the spectral distribution $3b$ of absorption coefficient of the molecule 3 existing in the free space is greatly different from the spectral distribution $2b$ of absorption coefficient of the molecule 2 adsorbed on the surface of the substrate 1. When radiation 12 having a wavelength $\lambda_1$ which is indicated by a broken line in FIG. 1B irradiates the substrate 1, the radiation 12 is scarcely absorbed by the molecule 3 existing in the free space, and is strongly absorbed only by the molecule 2 which is held, by adsorption, on the substrate 1. As a result, only the molecule 2 adsorbed on the surface of the substrate 1 can be excited. Further, in the present invention, kinds of the molecules 2 and 3 and the wavelength of the radiation 12 are selected so that the spectral absorption characteristics shown in FIG. 1B can be obtained only for the predetermined material forming a pattern on the substrate 1. In this case, the radiation 12 may be adsorbed by the predetermined material or may be absorbed by the adsorbed molecule 2, but it is essential in this invention that the absorbed radiation energy is used for exciting or dissociating the adsorbed molecule 2.

In the case where a thin film is formed in accordance to the present invention, the molecule 2 of raw gas (namely, reaction gas) adsorbed on the surface of the substrate 1 is dissociated by the radiation 12 into a desired atom (or molecule) and the remaining part, to form a layer of the desired atom (or molecule) on the predetermined material forming a pattern on the substrate, or to form a layer of an atom (or molecule) produced by the reaction of the desired atom (or molecule) with another raw gas, on the predetermined material forming a pattern on the substrate. In this case, it is preferable to maintain the substrate 1 at an appropriate temperature. When the temperature of the substrate 1 and the deposition rate of the atomic (or molecular) layers are appropriately selected, the atomic (or molecular) layers can be grown one by one so as to have a crystalline structure.

In the case where an etching operation is performed in accordance with the present invention, only an etching gas adsorbed by the predetermined material forming a pattern on the substrate 1 is made active by the radiation 12 or is dissociated by the radiation into a desired radical and the remaining part, to remove one or a few atomic (or molecular) layers of the predetermined material, thereby etching the pattern.

As is evident from the above-mentioned, it is important that a strong interaction is present between the adsorbed molecule and incident radiation. Accordingly, it is preferred to provide means for making high the electric field strength of radiation at a place where adsorbed molecules are present. At the surface of material, light incident on the material and reflected light therefrom interfer with each other, and the electric field strength is determined by the above interference. The state of the reflected light depends upon the refractive index (strictly speaking, the complex refractive index in which an absorption loss is taken into consideration as an imaginary part) of the material, the state of polarization of the incident light, and the incident angle. Accordingly, it is desirable to appropriately select these factors.

Next, an embodiment of the present invention for forming a thin film will be explained, referring to FIG. 2. A substrate 1 is placed in a reaction chamber 4, and then the chamber is evacuated through a gas outlet 7. Thereafter, a raw gas is introduced into the chamber 4 through a gas inlet 6 to a predetermined pressure. Then, exciting light (namely, radiation for excitation) emitted from a light source 8 and having a wavelength $\lambda_1$ at which the radiation energy is absorbed by a raw gas molecule adsorbed by the surface of a desired material on the substrate 1 and not adsorbed by free atoms (or molecules) of the raw gas since $\lambda_1$ is longer than the wavelength range of the absorption spectrum of the raw gas, impinges on the substrate 1 through a window 5. Thus, only the raw gas molecule adsorbed on the desired material forming a pattern on the substrate 1, shows dissociative reaction. When the substrate 1 is heated by, for example, light emitted from another light source 9 and having a wavelength $\lambda_2$ in the infra-red range, a thin film is formed selectively as a pattern on the desired material on the substrate 1. If the exciting condition and the heating condition are appropriately selected, one atomic (or molecular) layer formation of a desired atom (or molecule) by the above dissociation is repeated to form a pattern of thin film of good crystalline quality. In this case, the raw gas does not absorb the exciting light, and hence the window 5 is not contaminated by the deposition. In some cases that two kinds of gases, namely, first and second raw gases may be introduced into the reaction chamber 4, the molecule of the first raw gas which is adsorbed on the surface of a desired material on the substrate 1, is excited by the exciting light to cause the excited molecule to react with the second raw gas, and thereby a pattern of a thin film made of the desired material is formed. Further, a raw gas is easily adsorbed on the surface of a desired material on the substrate by cooling the substrate 1.

The substrate 1 may be irradiated continuously with the exciting light. In the case where one atomic (or molecular) layer is deposited one by one, to form a pattern of a thin film which is made of a desired material on the substrate, it is desirable that the substrate 1 is irradiated with pulse-like exciting light having a repetition period T and a pulse width $\tau$. When the absorption cross section of a gas molecule adsorbed on the surface of the desired material (or the substrate) and the number of light quanta which are emitted from the light source 8, have energy corresponding to the wavelength $\lambda_1$, and impinge on the above surface per unit area and unit time, are expressed by $\sigma$ and n, respectively, the pulse width $\tau$ is required to be equal to or greater than $1/n\sigma$. Preferably, the pulse width $\tau$ is made equal to or greater than $10/n\sigma$. In this case, the exciting light is not required to be monochromatic radiation having the wavelength $\lambda_1$, but required not to have a wavelength component which can be absorbed by a gas molecule existing in a free space and a gas molecule adsorbed on the surface of other material on the substrate than the desired material, and to have a wavelength component which can be absorbed only by a gas molecule which is adsorbed on the desired material forming a pattern on the substrate. For example, when an absorption coefficient of gas molecules in the free space and the distance between the window 5 and the substrate 1 are expressed by k and l, respectively, a condition $kl < 10^{-1} N\sigma$ has to be satisfied, where N indicates the number of raw gas molecules adsorbed on the surface of the substrate per unit area.

Further, a pulse light source can be used as the light source 9 for emitting the heating light of the wavelength $\lambda_2$. When the thermal conductivity, specific heat and density of the substrate 1 are expressed by $\kappa$, C and $\rho$, respectively and the absorptance of the substrate 1 for the light of the wavelength $\lambda_2$ is expressed by a, the temperature of that portion of the substrate 1 which is between the light receiving surface and a plane in a distance of $\delta$ from the surface can be raised by a value T, by supplying a radiation energy of $\sqrt{\pi} a(\kappa/\delta)T$ to a unit area of the substrate surface for a period of $(\rho c/4\kappa)\delta^2$. In this case, the heating light emitted from the light source 9 is not required to be a monochromatic radiation of wavelength $\lambda_2$, but may be continuous radiation. When the continuous radiation is used as the heating light, the absorptance a of the substrate for the heating light is given by an average value over the wavelength range of the continuous radiation.

The substrate 1 where a thin film is formed can be kept in a low temperature, by maintaining an appropriate balance between heating and cooling by the thermal conduction to the rear surface of the substrate 1. In more detail, when the thickness of the substrate 1 is expressed by d, the repetition period of pulse-like light emitted from the light source 9 is required to be equal to or greater than $(\rho c/\kappa)d^2$.

Figure 4A:
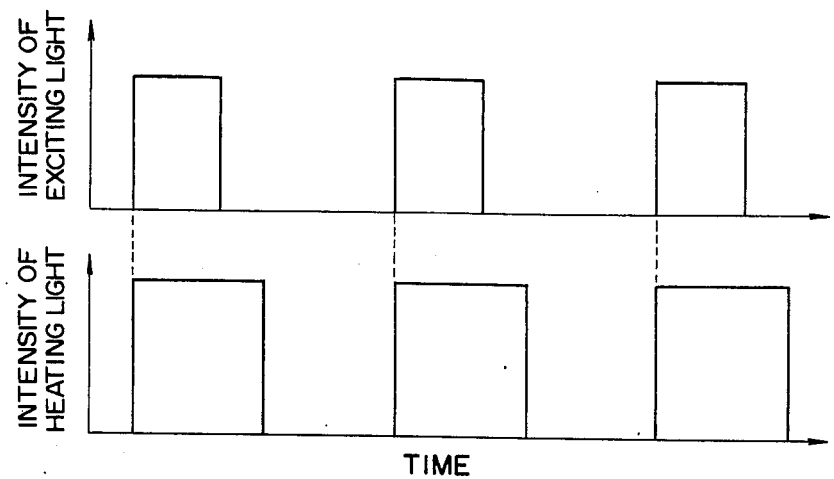
FIGS. 4A and 4B are waveform charts showing examples of the combination of light pulse trains which are used as the exciting radiation and the heating radiation in the present invention.
Figure 4B:
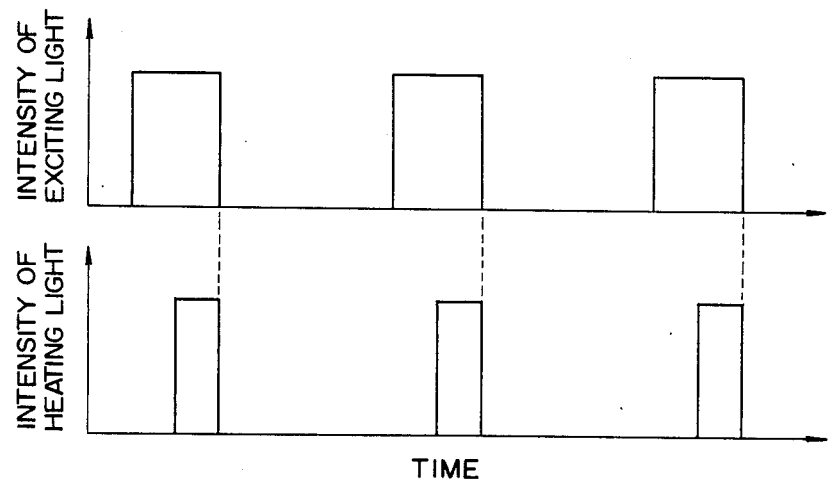

FIGS. 4A and 4B show examples of the phase relation between the exciting light pulse from the light source 8 and the heating light pulse from the light source 9. It is not always required that the exciting light pulse and the heating light pulse overlap each other, but a time interval may exist between the exciting light pulse and the heating light pulse. However, when the exciting light pulse and the heating light pulse are generated as shown in FIGS. 4A and 4B, the thin film can be formed in the shortest time.

In a special case, at least two kinds of gases A and B are contained in the reaction chamber 4 at the same time, and both the first light having a wavelength $\lambda_A$ to be absorbed only by a gas molecule A which is adsorbed on the surface of the substrate and the second light having a wavelength $\lambda_B$ to be absorbed only by a gas molecule B which adsorbed on the surface of substrate are used as the exciting light. When the first light and the second light alternately irradiate the surface of the substrate, one atomic (or molecular) layer resulting from the gas A and one atomic (or molecular) layer resulting from the gas B are alternately and repeatedly formed on a pattern of a desired material on the substrate.

Figure 5:
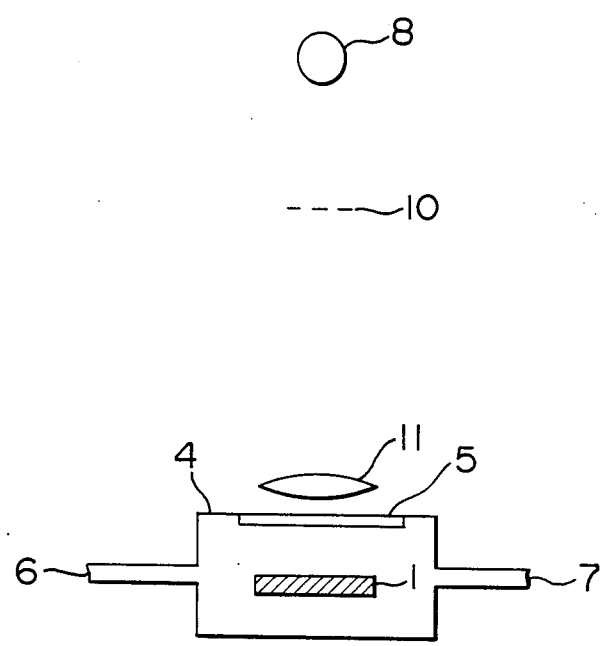
FIG. 5 is a schematic diagram showing the fundamental structure of another apparatus for carrying out a method of photochemical surface treatment according to the present invention.

Another embodiment of the present invention for forming a thin film will be explained below, referring to FIG. 5. Light emitted from an exciting light source 8 and having a wavelength $\lambda_1$ impinges on a substrate 1 whose entire surface is made of the same material, through a mask 10, a lens 11 and a window 5 so that the image of the mask 10 is formed on the substrate. In this case, a thin film can be formed on the substrate in a desired pattern corresponding to the image of the mask formed on the substrate. Needless to say, it is possible to use a concave mirror instead of the lens 11. It is preferred to provide a heater for heating the substrate 1, or the heating light source 9 of FIG. 2, though the heater and the heating light source 9 are omitted in FIG. 5.

All above-mentioned embodiments are concerned with the deposition of a thin film. The etching operation for a substrate can be performed in a manner similar to the deposition. That is, only an etching gas molecule (namely, a reaction gas molecule) adsorbed on a desired material forming a pattern on a substrate, absorbs exciting light, and thus is excited or produces a radical. When the kind of the etching gas, the wavelength $\lambda_1$ of the exciting light and the material to be etched, are appropriately selected, the pattern can be etched off by the excited molecule or the radical.

As has been explained in the foregoing, according to the present invention, only a molecule adsorbed on the surface of a desired material forming a pattern on a substrate, can be excited or dissociated by exciting light, in the state that the reaction chamber is kept to be filled with raw gas or etching gas. Therefore, in the case when deposition and etching are made with the precision of atomic scale, the throughput can be greatly increased.

The present invention is specifically effective in the case where a thin film of the same material as that provided on the surface of a substrate is formed by deposition. According to the present invention, a conductive film can be deposited only on a metal, and hence a throughhole can be easily filled with the conductive material. Further, according to the present invention, surface treatment only for a desired material forming a pattern on a substrate can be made without using any mask. Therefore, the alignment of the mask with the substrate required for exposing the substrate to radiation can be omitted, and the resolution can be enhanced without being restricted by the wavelength of the optical radiation.

We claim:

1. A method of photochemically treating a surface of a material, comprising the steps of:
    introducing a reaction gas into a reaction chamber having a substrate therein, to make the reaction gas be adsorbed on the surface of said substrate; and
    exposing said substrate to radiation of a wavelength at which the absorption of radiation energy by the reaction gas existing in the inner space of said reaction chamber is negligibly small and the radiation energy is absorbed by the reaction gas adsorbed on the surface of said substrate, the kind of the reaction gas and the wavelength of the radiation being selected so that the surface of a predetermined material forming a pattern on said substrate can be selectively treated.

2. A method of photochemically treating a surface of a material as claimed in claim 1, wherein said reaction gas is a raw gas for forming a thin film.

3. A method of photochemically treating a surface of a material as claimed in claim 1, wherein said reaction gas is an etching gas.

4. A method of photochemically treating a surface of a material as claimed in claim 1, wherein said radiation is pulse-like radiation.

* * * * *